United States Patent [19]

Hornak

[11] Patent Number: 4,717,216
[45] Date of Patent: Jan. 5, 1988

[54] MULTI CIRCUIT BOARD CARD ENCLOSURE

[75] Inventor: Andrew J. Hornak, New Milford, Conn.

[73] Assignee: General Datacomm, Inc., Middlebury, Conn.

[21] Appl. No.: 765,282

[22] Filed: Aug. 13, 1985

[51] Int. Cl.[4] ............................................. A47B 43/00
[52] U.S. Cl. .................................. 312/257 R; 211/41; 361/383; 361/390; 361/395; 361/399; 16/261; 16/382
[58] Field of Search ......... 211/41; 312/257 R, 257 A, 312/257 SM, 283, 320, 7.1, 7.2, 282, 126; 220/4 F, DIG. 25, 337, 338; 403/353; 361/383, 390, 395, 399; 16/261, 382; 248/220.4, 222.1, 222.2, 223.3; 358/254

[56] References Cited

U.S. PATENT DOCUMENTS

| | | | |
|---|---|---|---|
| 1,196,580 | 8/1916 | Pelot | 16/382 |
| 2,673,776 | 3/1954 | Barnhart | 312/282 |
| 3,730,605 | 5/1973 | Eckrd | 312/257 R |
| 3,811,745 | 5/1974 | Cylke | 312/245 |
| 3,966,285 | 6/1976 | Porch et al. | 312/257 R |
| 4,065,020 | 12/1977 | Carson | 220/337 |
| 4,086,709 | 5/1978 | Jackson | 248/222.2 |
| 4,294,496 | 10/1981 | Murez | 312/282 |
| 4,418,820 | 12/1983 | Nagle et al. | 211/41 |

FOREIGN PATENT DOCUMENTS

94285 6/1983 Japan .................................. 358/254

Primary Examiner—Joseph Falk
Attorney, Agent, or Firm—Howard I. Podell

[57] ABSTRACT

The invention is an enclosure for containing several printed circuit boards. Detechable brackets for mounting the enclosure to a rack, detachable latching door hinges and a combination of detachable members are assembled in an improved housing for detachably enclosing mounted printed circuit boards and other modular components and includes a base, a cover having a top and depending sides provided with slots; and vertical card guide brackets and a pivotable door. These detachable members are formed so as to to latch together into an integral assembly. The door when pivoted to the open position is held as a tray in the horizontal plane of the base and does not drop below the base, with a peripheral rim of the door serving as sides of the tray.

11 Claims, 11 Drawing Figures

MULTI CIRCUIT BOARD CARD ENCLOSURE

FIELD OF THE INVENTION

This invention relates generally to a housing for containing several printed circuit boards, which enclosure is formed of separate sections that may be assembled together.

PATENT INFORMATION DISCLOSURE STATEMENT

Prior publications as exemplified by U.S. Pat. Nos.

| | | | |
|---|---|---|---|
| 4,337,499 | 4,426,675 | RE 29,371 | 4,076,353 |
| 4,356,531 | 4,301,494 | 3,479,568 | 4,471,898 |
| 3,997,819 | 4,153,127 | and | 3,831,128 | are generally illustrative of various devices of this type. While such devices are usually acceptable for their intended purposes, they have not proven to be entirely satisfactory in that they are either complex and or require unusual skill and or dexterity to operate. As a result of the shortcomings of the prior art, typified by the above, there has developed and continues to exist a substantial need for devices of the character described. Despite this need, and the efforts of many individuals and companies to develop such devices, a satisfactory device meeting this need has been heretofore been unavailable.

The principal object of this invention is to provide an article of this character which combines simplicity, strength and durability in a high degree, together with inexpensiveness of construction.

Other objects of this invention will in part be obvious and in part hereinafter pointed out.

SUMMARY OF THE INVENTION

The invention is an enclosed for containing several printed circuit boards including detachable brackets for mounting the enclosure to a rack detachable latching door hinges and a unique construction of members fitted together with a minimum of fasteners.

The invention includes a base, a cover having a top and depending sides provided with slots, internal vertical card guide brackets with vertical detents on the base frictionally engaging the brackets; cover slots which interlock with tabs projecting from the card guide brackets; a rear panel with slots which interlock with tabs extending from the back of the top cover. The rear panel is also fastened to the rear of the card guide brackets. The rear panel has slots which interlock with base tabs. Between one internal card guide bracket and a side are fixed a control panel, a transformer and cooling means. Slots of hinge slide units are provided in the front of the base to receive specially shaped hinge levers pivotally mounted to the bottom of a front door. The shape of the hinge slide slots and the hinge levers prevent disassembly of the hinge by normal horizontal motion in the emgaged position by friction and by the geometry of an interlocking fit, yet permit removal of the door from the base by a sliding motion in an upward diagonal direction. In the fastened position of the hinge assembly, the door when pivoted to the open position is held in the horizontal plane of the base surface and does not drop below the base.

BRIEF DESCRIPTION OF THE DRAWING

In the accompanying drawing, one of the various possible illustrative embodiments of the this invention is shown utilizing like reference characters to identify the same or like parts and using direction-oriented terms such as up, down, rearwards, horizontal and the like for descriptive purposes to identify the operation for the parts in the preferred orientation of use of the embodiment as shown in the drawing where.

DESCRIPTION OF THE BEST MODE OF THE INVENTION

Figure 1:
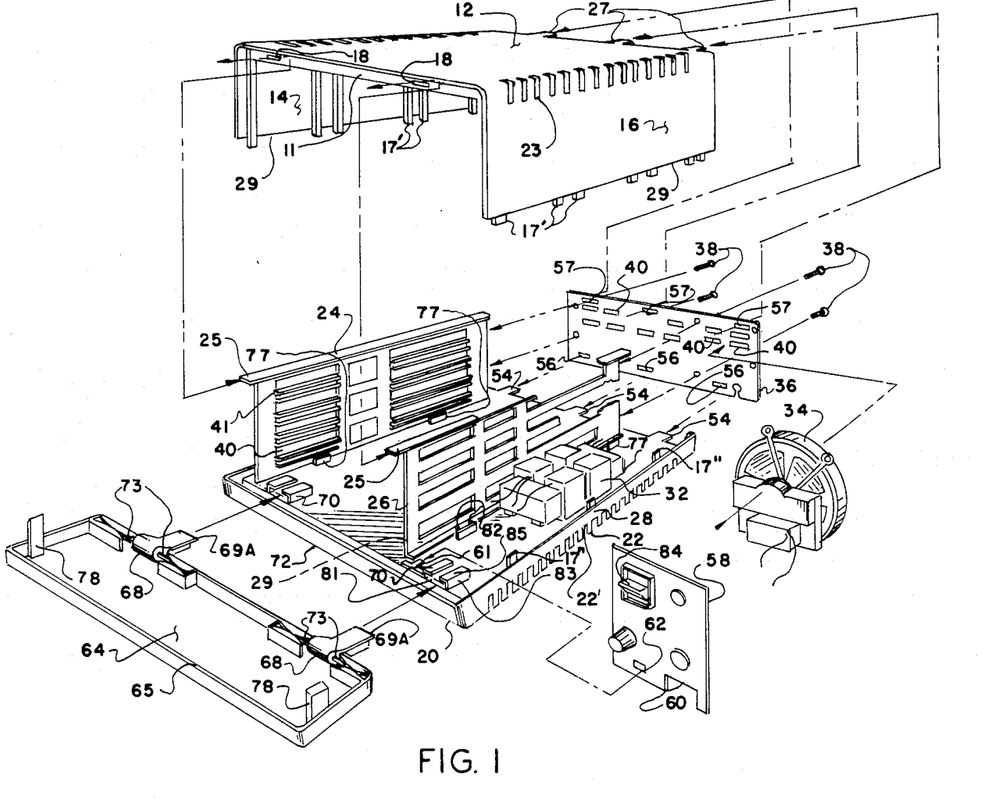
FIG. 1 is an exploded view of a four card housing of the invention.
Figure 2:
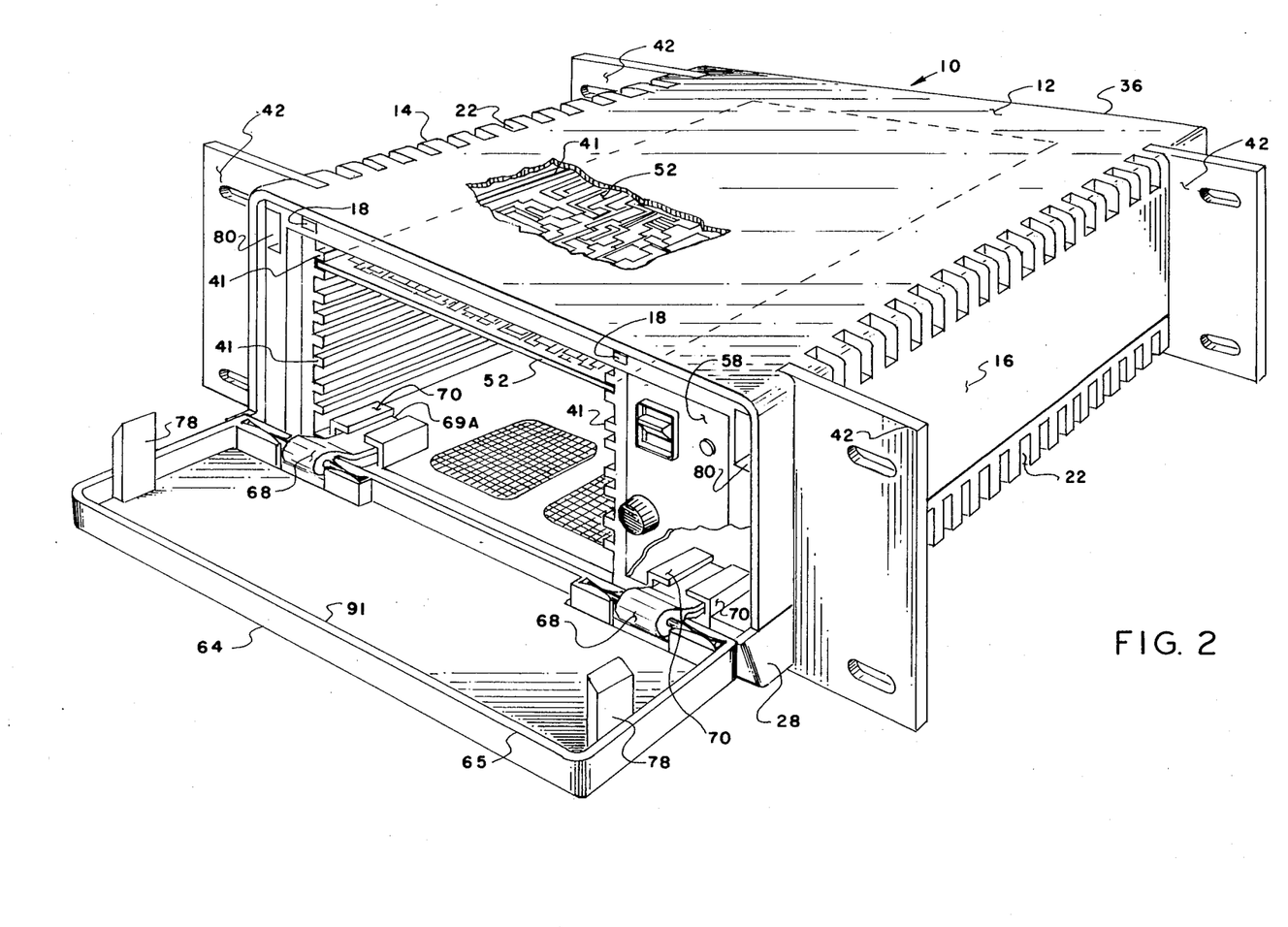
FIG. 2 is an assembled view of the same.

Referring descriptively to the drawing, in which similar reference characters denote similar elements throughout the several views, and more specifically to FIGS. 1 and 2, the invention is generally designated by character 10. The housing 10 includes a cover 12 with depending sides 14 and 16. The cover preferably is formed of plastic material. Its upper front rim have shaped slots 18 of a size to be engaged by tabs 25 which extend forward in a horizontal plane from the card guide brackets 24,26.

Figure 8:
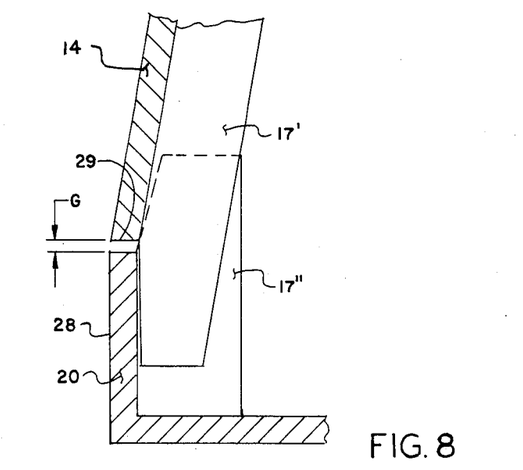
FIG. 8 is a detail sectional view of the cover wall engaged to the base rim.

As shown in FIG. 8, the cover 12 has a number of downwardly extending shaped posts 17' located to frictionally engaged and bear against the inside surface of side rim 28 of base 20. Similar shaped posts 17" extend upwardly from the inside of rim 28 of base 20 to frictionally engage and bear against the side walls 14,16 of the cover in the engaged mode of the cover to base, providing frictional engagement of the cover 12 to the base 20 when installed. When the cover is fully engaged to the base, the bottom edge 29 of the cover normally remains separated from the top edge of the base by a gap distance "G".

The base 20 is formed with a plurality of parallel vent slots 22 along the lower side corner sections of the base 20. Each side panel 14 and 16 of cover 12 is formed with similar parallel vent slots 23 along the upper side corner sections of the cover unit.

Figure 9:
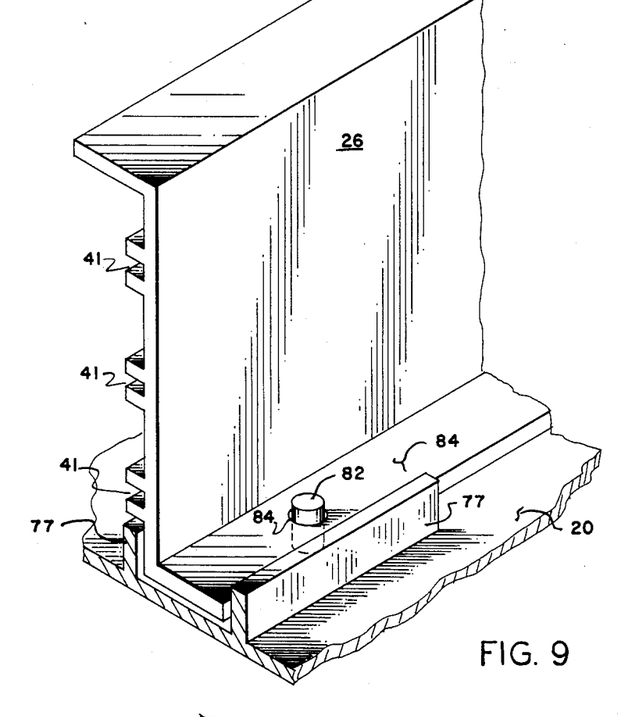
FIG. 9 is a detail perspective view of the card guide bracket engaged to the base.

A pair of preferably metallic card guide brackets 24,26 are removably fastened in the housing interior. As shown in FIG. 9, upward projecting detents 77 extend from base 20 on each side of the bracket locations to serve as installation guides and shear projections with additional retention clips or screw fasteners provided to latch the brackets in place, when engaged. Vertical posts 82 fixed to the base 20 extend upwardsly to each engage in a hole 84 of a bottom rim 86 of an installed bracket 26. The brackets each have horizontal grooves 41 which face the interior of the housing for the receiving of and rentention of printed circuit boards 52 which may be slid into or out of the enclosure along a horizontal plane when door 64 is open. A bracket 26 as shown in FIG.1 is spaced at a distance from the adjacent peripheral side rim 28 of base 20, to bound a power source compartment 30. Transformer 32 and cooling means such as fan 34 may be mounted in compartment 30, as shown in FIGS. 1 and 2. A preferably metallic rear panel 36 is fastened to the rear of brackets 24, 26 by four screws 38. Cover 12 is formed with tabs 27 which extend rearwardly along a horizontal axis to be received in slots 57 of rear panel 36.

Vent openings 40 are formed in rear panel 36 as well as in brackets 24, 26 and corner openings 22 of the base and corner openings 23 of the cover serve both as vent openings of the cover and base, as well as slots to receive hook sections of optional mounting brackets 42, assembled to the housing when the housing is to be mounted to a rack.

Four detachable mounting brackets 42 serve for rack mounting of the unit 10 in, for example, standard nineteen inch racks. Each bracket 42 is of a shape to hook into a pair of upper and lower vent openings 23, 22 of both cover 12 and base 20, respectively, and eliminates the need for other rack-mounting hardware, except for screws (not shown) which bolt the brackets 42 to rack members (not shown) through bracket slots 79. Each identical shaped bracket 42 fastens the unit 10 to one of the four corner posts of a standard rack.

Figure 3:
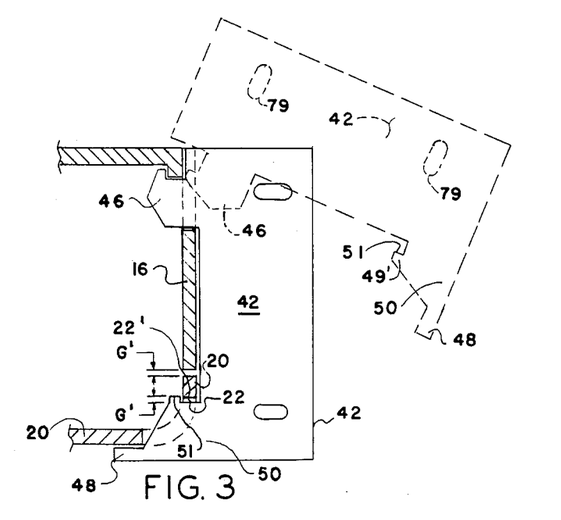
FIG. 3 is a detailed view of the mounting bracket in use.
Figure 3A:
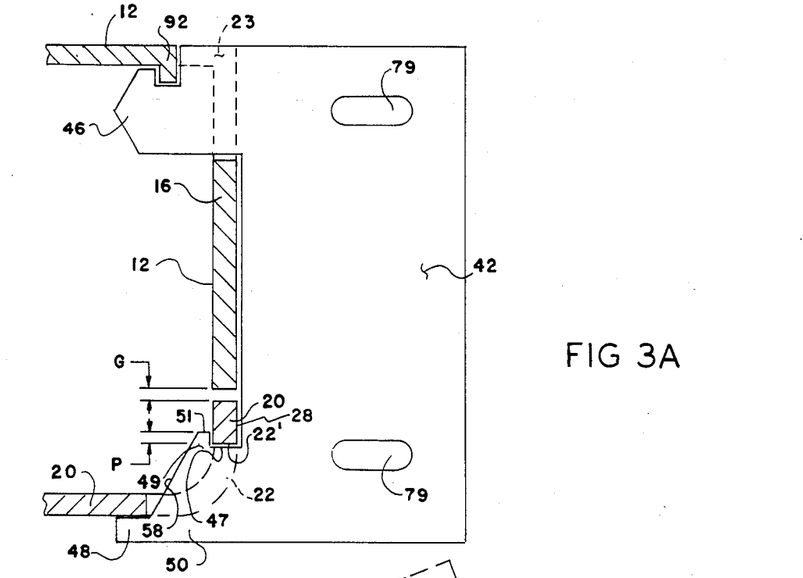
FIG. 3A is a detailed view showing fastening of mounting bracket to the base and cover side panels.
Figure 3B:
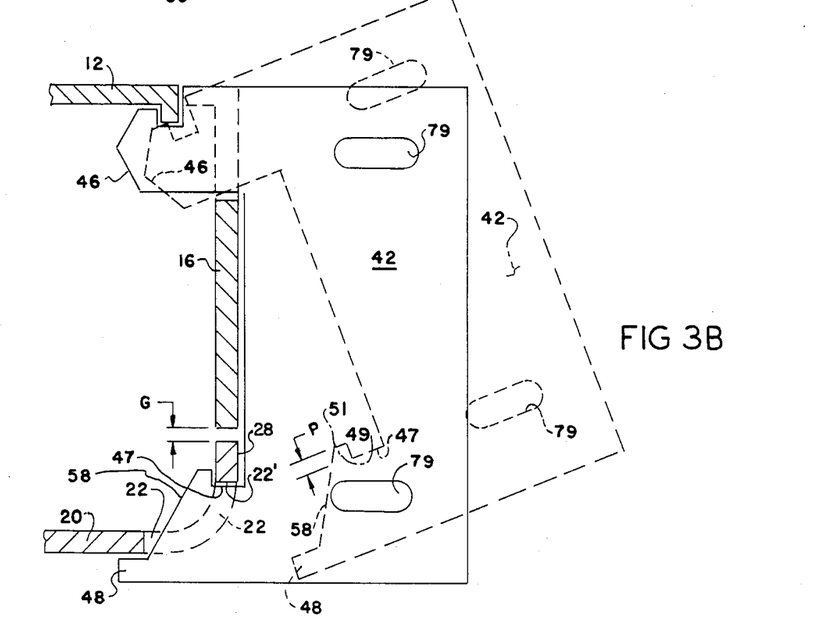
FIG. 3B is a detailed view showing the manner in which the mounting bracket is rotated out of engagement to the base and cover side panels.

As shown in FIG. 3A, each bracket 42 has a hook upper portion 46 of a shape to fit into and engage in a cover vent slot 23. A bracket flange portion 50 extends horizontally from the lower section of the bracket terminating in finger section 48 that extends under base 20 to provide load support of the base in the engaged position. A hook-shaped section 49 is of a shape and size to enter a vent slot 22 in the base to engage the top edge section 22' in the base 20 which bounds vent slot 22. An upwards projecting detent section 51 of hook-shaped section 49 extends above horizontal bracket bearing surface 47 by a distance "P" which is no greater than gap distance "G" separating the cover side from the side of the base rim. A bracket 42 is rotated into latching engagement with the enclosure, as shown in FIGS. 3A, 3B, bevel edge 58 wedges resilient rim edge section 22' upwards to provide clearance for detent section 51 to latch into engagement with the base rim, with rim section 22' then springing back to prevent reverse rotation of the bracket out of engagement.

In the installed mode of the bracket, detent 45 of upper hook section 46 is latched in position against projecting detent 92 of the cover.

Removal of the bracket may be accomplished by momentarily manually clamping cover 12 against base 20 so as to reduce gap "G" to less than the projecting interfering height detent section 51 and then rotating the bracket away from the enclosure. Thus interlocking upwards and sidewards support for the assembly is provided when the installed brackets are each bolted to a vertical support of a rack unit.

The hook-shaped projections of the brackets 42 are shaped so that a bracket may be readily engaged or disengaged to the housing when the housing is not supported by the bracket, but the shape of the projections are such that no bracket may be inadvertently detached from engagement with the housing when the bracket in supporting the housing in the normal mounted position of the housing and bracket. The bracket projections retain an engaged side wall of the housing against lateral, longitudinal and vertical motion in the fully engaged mode of the bracket to the housing. The identical shaped bracket 42 is adaptable for use in any of the four mounting locations, with each bracket of a thickness that is substantially that of the width of the vent openings 22,23 in the base and cover, so as to provide for a snug fit of each bracket in the vent openings and limit movement of an enclosure unit 10 mounted by the brackets.

As shown in FIGS. 1 and 2, several printed circuit boards 52 may be retained in spaced horizontal array engaged in opposed open grooves 41 of the sides 14,16. The boards 52 may be readily slid into or out of the open front of the enclosure when door 64 is in the open position.

Base tabs 54 extend rearwards in the horizontal plane from the rimless back part of the base to engage and interlock with bottom open slots 56 of rear panel 36. In the assembled mode, sides 16 and 14 are frictionally engaged to base 20 by vertical extending posts 17' and 17'', and rear panel 36 is engaged to base 20 by base tabs 54 extending horizontally into panel slots 56. Rear panel 36 is also engaged to cover 12 by rearward extending tabs 27 that extend backwards from cover 12 to engage upper open slots 57 in panel 36 so as to form an interlocked integral unit of cover 12, base 20 and rear panel 36.

A plastic power panel 58 has a lower cut-out portion 60 which fits over and about an upraised hinge slide unit 70 and a slot 62 which interlocks with horizontally extending tab 61 on the base to latch panel 58 into a vertical plane when installed.

A door 64, preferably formed of plastic material, with rim 65 is provided and is removably secured to the base 20 as shown in detail in FIGS. 4-7. The door 64 is fitted with a hinged lever member 55 that is detachably frictionally latched to a slide unit fixed to the base section unit, so that the door may be readily removed and reinstalled from or to said housing as desired, with the door pivotally fitted to said hinge lever so as to be rotatable, when installed, about the axis of door pivot pin 68 to which the hinge lever is pivotally mounted, with the door 64 serving as the front wall of the housing the closed position.

Figure 4:
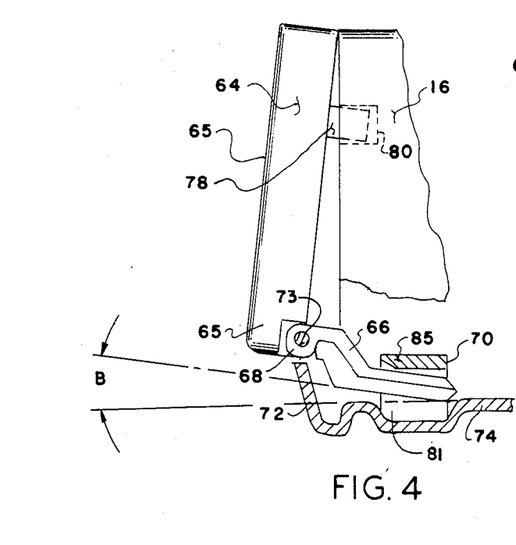
FIG. 4 is a detailed view showing attachment of the front door to the base.
Figure 6:
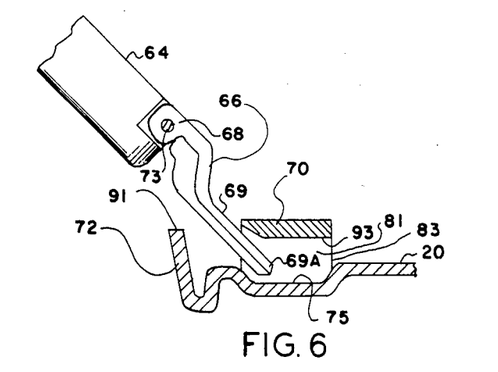
FIG. 6 is a detail view of the hinge arrangement of the door and enclosure, with the door disengaged from the enclosure.

As shown, a pair of shaped molded plastic hinge levers 66 is each fastened by a door pivot 73 that is pivotally mounted in hinge pivot section 68, with each pin 73 swaged in place to door rim 65 at the bottom of door 64. The tongue section 69 of each lever 66 fits into a slot chamber 81 of the base 20. slots chamber 81 is bounded by a pair of inverted "L"-shaped walls 83 of a hinge slide unit 70 that extends upwards from the inside bottom surface of base 20. The upper horizontal portion 85 of each hinge wall 83 extends above the bottom of the base preferably to less than the height of the top of upstanding front rim 72 of the base 20, as shown in FIG. 4. As shown in FIG. 6, hinge levers 66 are manually oriented along a downward diagonal angle to enter the hinge slides 70 with levers 66 each formed with a tapered tip 69A to facilitate entry of each lever into the slide.

Figure 7:
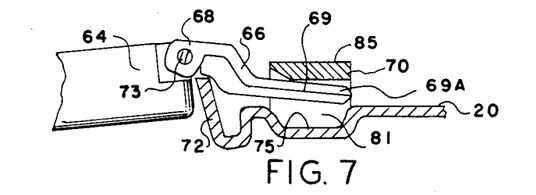
FIG. 7 is a detail view of the hinge arrangement with the door fully opened, but with the door hinge unit fully latched to the enclosure.

FIG. 7 shows how the door abuts the base when the door is opened so as to prevent the open door from rotating substantially below the a horizontal plane of the bottom of the base when open. Such restraint prevents an open door from striking any rack-mounted unit located below the housing on the same rack frame, and enables an open door to serve as a horizontal tray. A rim section 65 of door 64 extends inwardly in the closed position of the door so as to abut walls of the housing cover, with this rim section serving as an upraised rim of a tray in the open position of the door when the face of the door bounded by said rim section extends along a substantial horizontal plane. The door is readily installed in place or removed from the housing without recourse to any hardware or other fasteners.

As shown in FIG. 4, the tongue section 69 of each hinge lever 66 freely initially slides into the slot chamber of a hinge slide 70 with little initial wedging action between the upper horizontal portion 85 of each hinge wall and the bottom surface of the base, where a slight angle "B" defines the angle between the horizontal inside base surface and the angle of the hinge tongue section 69, prior to "forcing" the hinge tongue beyond an interference fit into the fully installed position. The bent shape of the hinge 66 abuts the inside surface of base rim 72 if the door is pulled directly away from the housing, to prevent such motion from dislodging the hinge from the installed position.

The upraised rim section 72 forming the front edge of base unit 20 extends preferably above the upper wall 85 of the open chamber 81 in the slide member which receives the hinge tongue member, wih the upper surface 93 bounding the chamber 81 preferably located below the top edge 91 of the base rim section in the normal position of use of the housing. The tongue member is offset to extend horizontally below the bottom rim of the door in the closed door position so that the said base rim section 72 limits outward horizontal motion of an installed hinge tongue member out of the chamber of the slide member, and prevents removal of the door unit from assembly with the base unit in either the closed or open position of the door by horizontal motion of the door hinge tongue member.

Figure 5:
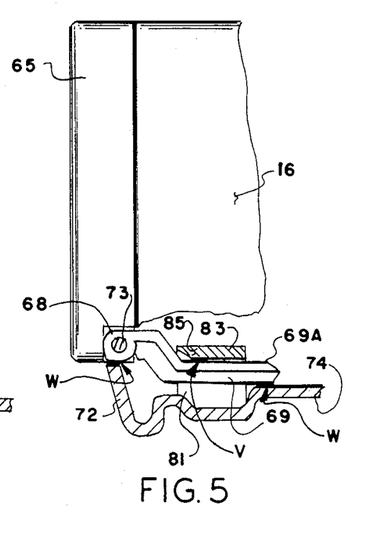
FIG. 5 is a similar view showing the door in the fully closed position, fastened to the the cover and base.

As shown in FIG. 5, a recess section 75 is formed in the base directly below the hinge slides 70 so as to permit the entering tongue tip 69A of a hinge tongue 69 to freely enter into the hinge slide chamber and recess prior to becoming wedged by bearing pressure below hinge tongue 69 at the two different marked points "W" of the base and by bearing pressure above the hinge tongue 69 at marked point "V" between marked points "W" shown in FIG. 5. In this wedged position, downward pressure is applied against the middle portion of the hinge lever, with upward pressure being applied at the opposed ends of the lever to slightly flex the resilient lever as a simple beam and produce latching friction against sliding action of the hinge tongue. These bearing points "W" are located at the surface of the base 74 beyond the slide 70; and where the bottom rim of the door abuts the top of the base rim 72. Bearing point "V" is located at the front upper portion 85 of the hinge slide wall.

Manual pushing of the door 64 to the flush closed position causes this wedging action, which frictionally fixes the hinge levers in place in the hinge slides at the three bearing points marked "W" and "V" of FIG. 5 and also frictionally holds the door in the closed position flush against the cover 12. In this manner, the tongue member, the slide member and the upraised base rim section are juxtaposed so that in the assembled and closed mode of the door unit:

(1) portions of a bottom surface of the hinge lever member, near the forward tip of the tongue member and near the pivot of the rear end of the lever member, each bear in frictional engagement against a portion of the interior surface of the base member at points "W" and "V";

(2) a portion of an upper surface of a mid-section of said tongue member bears in frictional engagement against an upper surface of the slide member bounding the slide member chamber at point "V". These bearing forces which are thus applied act as those of a simple beam on the hinge tongue member to resiliently flex the hinge lever member sufficiently to wedge and retain the tongue member in frictionally latched engagement with the slide member, when the tongue member is fully inserted into the slide member. Free withdrawal is readily achieved by manually moving the tongue member in an upward diagonal directional once the tip 69A of the tongue and the rim of the door have each been simultaneously released from bearing engagement, by the manual upward diagonal movement. The bearing engagement of the bottom of the rim of door 64 against the upper edge of base rim 72 also serves to frictionally maintain the door in the closed position. The upward bearing pressure at point "W" applied by the rim 72 of the base to the flange of the door at the hinge pivot 68 of the hinge tongue also serves to apply upward bearing pressure from door latching tabs 78 against the walls of slots 80 in the cover section 12. As shown in FIGS. 1 and 2, projection tabs 78 extend from the rim 65 of door 64 to wedge inside slots 80 formed in the side panels 14,16 of the cover section 12.

The shape of the hinge slots and of the hinge levers, prevent normal horizontal motion of hinge tongues in the slots in the engaged position, yet will permit removal of the door from the base in a sliding motion by the application of force along an upward diagonal direction when desired. Pivotal action of the door is not restrained except for the latching and frictional action in the closed position and the abutting action which prevent opening of the door substantially below the horizontal plane of the bottom of the housing base.

Among the advantages of the invention that should be noted that the articulating and sliding action of the hinge unit prevents the door from encroaching upon frontal rack area below or above the housing, in any operating position of the door.

The sliding action of the hinge and the pointed tip of the hinge tongue provides a friction locking mechanism of the door to the housing.

The hinge mechanism provides for the hinge and door assembly to be completely removed from the enclosure housing without any requirement for other hardware, fasteners or tools.

The hinge lever may be formed of a shaped plastic strip doubled upon itself to fit through and pivot about a slot in the door rim, or to pivot about a pin 68 fixed to the rim 65 of the door. It may be formed of a plastic or other resilient material which is pivotally fixed by a pin 68 to the rim of the door.

The door mechanism and hinge unit of my invention provides the following advantageous solutions to conventional problems encountered with prior art devices of this character:

(1) The removal of the door does not require removal nor loosening of hardware.

(2) The use of tools are unnecessary for removal or replacement of the door.

(3) Easy access is provided to the power switch 84 and to the interior of the housing for removal or installation of circuit boards. The entire vertical cross-section of the interior of the housing is free of interference with the opened door.

(4) Economies of production in both labor and material are provided by the elimination of fastening hardware of the door, rack brackets and assembly of the entire housing, save for the few screws employed to fix the rear panel to the interior card guide brackets which serve to prevent any disassembly of the housing cover, base and card guide brackets from each other.

(5) The mounting mechanism and rack brackets allows the housing to be mounted in a standard nineteen inch width rack or alternatively in a cabinet. The rack mounting brackets are readily removed when it is desired to install the housing within the walls of a cabinet. When in place, the rack mounting brackets support the housing adjacent to all end corners of the housing for stabilized support. Since the rack mounting brackets fit into the standard ventilation slots, the cosmetic integrity of the enclosure is not comromised when the enclosure is utilized without brackets such as in the stand-alone mode.

(6) All four mounting brackets are of identical size and shape, with each bracket being adaptable for use in either a left or right side location and in either a front or rear location.

(7) The enclosure can be of a size to handle forty watts of power controlled in the power source compartment and to detachably retain in the card guide brackets four spaced apart printed circuit boards.

The device of the invention has been thoroughly tested under actual use conditions and has been found to be completely successful for the accomplishment of the above-stated object of the present invention.

The operation and use of the invention hereinabove described will be evident to those skilled in the art to which it relates from a consideration of the foregoing.

Having thus described the invention, what I claim a new and desire to secure by Letters Patent of the United States is:

1. A housing for printed circuit boards, comprising:
    a cover having a top wall and first and second depending side walls; a rim in said top wall;
    said rim having spaced slots; said cover having a plurality of spaced posts depending from said side walls;
    a rectangular housing base having a peripheral rim with an inside surface, top and bottom edges; a pair of parallel vertical card guide brackets removably mounted on said base and having a top edge; said card guide brackets having at the upper front part thereof forward extending tabs engageable in said slots of said rim of said cover; said guide brackets having opposing open grooves; and said tabs of said card guide brackets being received in said slots;
    said base having a plurality of upstanding posts frictionally engaging said sides of said cover;
    said posts on said cover frictionally engaging said inside surface of said peripheral rim;
    said bottom edge of said cover being separated by a vent gap from said top edge of said base when said cover is fully engaged with said base and when said base and said cover are mutually assembled to said card guide brackets and to a rear vertical panel;
    a plurality of vent slots along the sides of said peripheral rim of said base adapted to receive detachable mounting brackets and similar vent slots along the upper side corner sections of said cover;
    one of said guide brackets being spaced from the adjacent peripheral side rim of said base to define a power source compartment;
    said rear vertical panel removably secured to the rear of said brackets and to the rear of said cover;
    spaced detachable mounting brackets removably secured to said vent slots of said cover and said rim, said spaced detachable mounting brackets having means for engaging said vent slots; a door having a peripheral rim and a base at the bottom thereof, said door shaped so as to bear against the bottom of said housing base in the fully open position of said door, so as to prevent said door from rotating below the horizontal plane of said door in said fully open door position, and a hinged lever detachably securing said door to said housing base.

2. A housing for printed circuit boards and the like, comprising
    a base section unit and a cover section unit having a top wall, and first and second depending sidewalls;
    said units being fitted with latch means to mutually engage and detachably latch together so as to form an integral housing for at least one circuit board unit, together with circuit board mounting means fitted in said housing for detachably mounting circuit boards in the interior of the said housing;
    a back panel unit, and
    a pair of circuit board retention brackets which comprise said circuit board mounting means vertically mounted in the interior of the housing;
    said base section unit and each card retention bracket being fitted with first detachable means to loosely interfit and to be free to be mutually engaged or disengaged by motion thereof in a vertical direction;
    said base section unit and said cover section unit being similarly fitted with second detachable means to loosely fit both units together so as to be free to be mutually engaged or disengaged by motion thereof in a said vertical direction;
    said back panel unit being fitted with detachable means to individually engage by motion in a horizontal direction, the base section unit, said cover unit and said card retention brackets, when assembled together, so as to restrain relative motion of the assembled units and brackets to each other in said vertical direction, together with
    screw means to retain said units and said card retention brackets assembled together, said screw means acting to prevent motion in a horizontal direction of the assembled units relative to each other, when said screw means is engaged.

3. The housing of claim 2 including screw means to retain said back panel in an assembled mode with said brackets in which the base unit, the cover unit, the circuit card retention brackets and the back panel unit are mutually assembled together to prevent motion relative to each other.

4. The housing of claim 2, in combination with a door unit,
said door unit having hinge means along a given axis incorporating means to frictionally latch said hinge means to the base section unit, said base section unit having a means to receive said hinge means; whereby
said door may be readily removed and reinstalled from or to said housing, said door being pivotally mounted to said hinge means so as to be rotatable, when installed, about said axis of said hinge means, to or from a closed position, wherein, in closed position, said door also serves as an external wall of said housing.

5. The housing of claim 4 in which said door unit and said base unit abut and form stop means, said stop means acting to limit rotation of said door about said hinge axis, in the direction of opening of said door unit, to substantially the plane of said base unit, said stop means serving to prevent the door in an open position from obstructing access to any other accessor mounted below the said housing.

6. The housing of claim 5 in which the door unit is formed with a peripheral rim section that extends inwardly in the closed position of the door so as to abut walls of the housing cover, said rim section constituting the peripheral rim of a tray in the open position of the door when the face of the door bounded by said rim section extends along a substantially horizontal plane, with said stop means arranged to maintain the said door face in a substantially horizontal position, in the opened position of the said door unit.

7. The housing of claim 4, having a slide member in which the hinge means of the door unit comprises a shaped hinge tongue member having a leading edge to frictionally engage, in the assembled mode, said slide member, said tongue member being fixed to the base unit.

8. The housing of claim 7 in which said rim section is formed along the front edge of the base unit, said slide member defining an open chamber of a size to receive said tongue member,
said chamber having an upper surface located substantially along the plane of the upper edge of said rim section in closed position of the housing, said tongue member and said rim section limiting outward horizontal motion of an installed hinge tongue member out of said chamber of said slide member, so as to prevent removal of the door unit from assembly wih the base unit in either the closed or open position of the door unit by preventing horizontal motion in the engaged position of the housing with the door hinge tongue member.

9. The housing of claim 8 in which said base member has a recessed section directly below and continuous wih said open chamber of the slide member to permit said leading edge of said hinge tongue member to extend below the plane of the remainder of the interior surface of the base unit, when the tongue member is removed or installed along a an axis diagonal to the horizontal axis, so as to clear interference with the upraised base rim section.

10. The housing of claim 8, wherein said shape of the hinge tongue member, the slide member and the upraised base rim section interfit in the assembled and closed mode of the door unit, to cause a portion of a bottom surface of the tongue member to frictionally engaged against a portion of the interior surface of the base member and to cause a portion of an upper surface of said tongue member to bear in frictional engagement against a surface of the slide member; said surface of said slide member forming an upper boundary of said slide member chamber, thereby creating bearing forces which wedge and retain said tongue member in frictionally latched engagement with said slide member, when said tongue member is fully inserted into said slide member.

11. The housing of claim 10 in which, in the assembled and fully closed mode of said door unit, a surface of the door bears in frictional engagement against the upper surface of the base rim, so as to frictionally maintain said door in the closed position, said engagement also acting to apply bearing pressure at frictionally engaged portions of said hinge tongue member to the slide member and at frictionally engaged portions of the tongue member to the base member, so as to maintain the fully inserted hinge tongue member in engagement with the base member.

* * * * *